United States Patent [19]

Lammerts et al.

[11] Patent Number: 5,083,295
[45] Date of Patent: Jan. 21, 1992

[54] INTEGRATED MEMORY CIRCUIT WITH INTERCONNECTED SENSE AMPLIFIERS

[75] Inventors: Judocus A. M. Lammerts; Willem G. J. Ritzerfeld; Michael J. Tooher, all of Eindhoven, Netherlands

[73] Assignee: U.S. Philips Corp., New York, N.Y.

[21] Appl. No.: 444,929

[22] Filed: Nov. 30, 1989

[30] Foreign Application Priority Data

Dec. 2, 1988 [NL] Netherlands .................. 8802973

[51] Int. Cl.$^5$ .................. G11C 7/00; G11C 11/409
[52] U.S. Cl. .................. 365/205; 365/189.04; 365/207; 365/208; 307/530
[58] Field of Search .................. 365/189.04, 205, 207, 365/208, 230.01; 307/530

[56] References Cited

U.S. PATENT DOCUMENTS

| | | | |
|---|---|---|---|
| 3,879,621 | 4/1975 | Cavaliere et al. | 307/530 |
| 4,131,951 | 12/1978 | Asahi | 365/203 |
| 4,555,777 | 11/1985 | Poteet | 365/205 |
| 4,804,871 | 2/1989 | Walters, Jr. | 365/205 X |
| 4,813,021 | 3/1989 | Kai et al. | 365/227 X |
| 4,879,692 | 11/1989 | Tokushige | 365/205 X |

FOREIGN PATENT DOCUMENTS

56-94574 10/1981 Japan .

OTHER PUBLICATIONS

IBM-TDB vol. 28, No. 3, Aug. 1985: "Bitline Restore Circuit for High Speed CMOS Arrays" pp. 1227-1228.
IBM-TDB vol. 18, No. 6, Nov. 1975: "Read and Write For Random Access Memory Array" pp. 1849-1850.
IBM-TDB vol. 29, No. 5, Oct. 1986 "Dense Sense Amplifier/Latch Combination" pp. 2160-2161.

*Primary Examiner*—Alyssa H. Bowler
*Attorney, Agent, or Firm*—Steven R. Biren

[57] ABSTRACT

An integrated circuit with a memory, includes a matrix of memory cells and sense amplifiers which are coupled thereto, with the inputs of the sense amplifiers being connected to one another and the outputs of the sense amplifiers being connected to one another via a read bus. During the reading of information from a memory cell, the sense amplifiers are simultaneously activated. As a result, the access time for reading information from a a memory cell remains substantially constant when the number of memory columns to be connected in parallel is changed. The dimensioning of the sense amplifiers may remain the same when the number of memory columns is changed, so that dimensioning need be performed only once. This results in a saving as regards time and costs.

7 Claims, 2 Drawing Sheets

INTEGRATED MEMORY CIRCUIT WITH INTERCONNECTED SENSE AMPLIFIERS

BACKGROUND OF THE INVENTION

The invention relates to an integrated circuit with a memory, comprising a matrix of memory cells and sense amplifiers which are coupled thereto and outputs of which are connected to one another and to a common data bus.

A circuit of the kind set forth is known from IEEE Transactions on Electron Devices, Vol. ED-31, No. 9, September 1984: Masayuki et al., "Design of GaAs 1 kBit Static Ram", notably from FIG. 1. The switching speed of the sense amplifiers used in the circuit is inter alia dependent on the parasitic capacitive load formed by the common read lines (read bus). This capacitive load is generally proportional to the length of these lines and hence dependent on the number of memory columns to be coupled. In a memory design where the number of parallel-arranged memory columns may be specified, for example by a customer (for example, in the case of application specific integrated circuits (ASIC's)), either the access time for reading a memory cell will be dependent on the number of columns or the dimensions of the transistors in the sense amplifiers must be adapted in view of the above capacitive load when the desired number of parallel memory columns is changed, so that a new design is required for a part of the memory circuit. The repeated redimensioning of transistors requires additional design time and hence has a cost-increasing effect.

SUMMARY OF THE INVENTION

It is inter alia an object of the invention to provide an integrated circuit with a memory in which, even though the number of memory columns to be connected to common read lines (read bus) can be selected at random, the access time is always substantially the same and the dimensions of the transistors in a sense amplifier can be maintained.

To achieve this, an integrated circuit with a memory in accordance with the invention is characterized in that there are provided activatable and deactivatable coupling means for coupling a single memory column to the input of each sense amplifier, there also being provided activation means for simultaneously activating each sense amplifier.

An integrated circuit with a memory in accordance with the invention offers the advantage that the access time for reading a memory cell remains the same for an arbitrary number of memory columns, and that the transistors in the sense amplifiers need be dimensioned only once, resulting in a saving as regards time and costs. The access time remains the same because, even though the capacitive load of the read lines increases when the number of memory columns to be connected to common read lines is increased, the number of parallel operating sense amplifiers connected to the read lines is also increased. Because of the sense amplifier (amplifiers) in the additional memory column (columns), the ratio of total gain to capacitive load remains substantially constant.

The inputs of the sense amplifiers are interconnected via common input lines, so that when information is read from a memory cell in a given column, the other sense amplifiers are simultaneously activated with the same information. The common input lines also form a capacitive load for the memory cell to be read, which parasitic capacitance is proportional to the number of memory columns. In practical cases, however, the parasitic bit line capacitance will be many times higher than the parasitic capacitance of said connection, because the number of rows in a memory column usually exceeds the number of parallel-connected memory columns (for example, 64 rows and 4 columns). As a result, the total parasitic capacitive load for a selected memory cell is substantially constant and substantially equal to the parasitic bit line capacitance.

A preferred embodiment of an integrated circuit with a memory in accordance with the invention is characterized in that the input of each sense amplifier is connected to its output. This offers the advantage that the connection between the sense amplifier inputs is already formed by the read lines present. As a result, the chip surface area required for the memory circuit is smaller and the chip lay-out is simpler. Moreover, the memory information is taken over more quickly because of the effect of the sense amplifiers on the information signal.

Another embodiment of an integrated circuit with a memory in accordance with the invention is characterized in that a sense amplifier is provided for each memory column. This offers the advantage that the memory circuit in accordance with the invention can be extended by way of single columns.

BRIEF DESCRIPTION OF THE DRAWING

The invention will be described in detail hereinafter with reference to embodiments shown in the drawing, in which.

DESCRIPTION OF THE PREFERRED EMBODIMENTS

Figure 1:
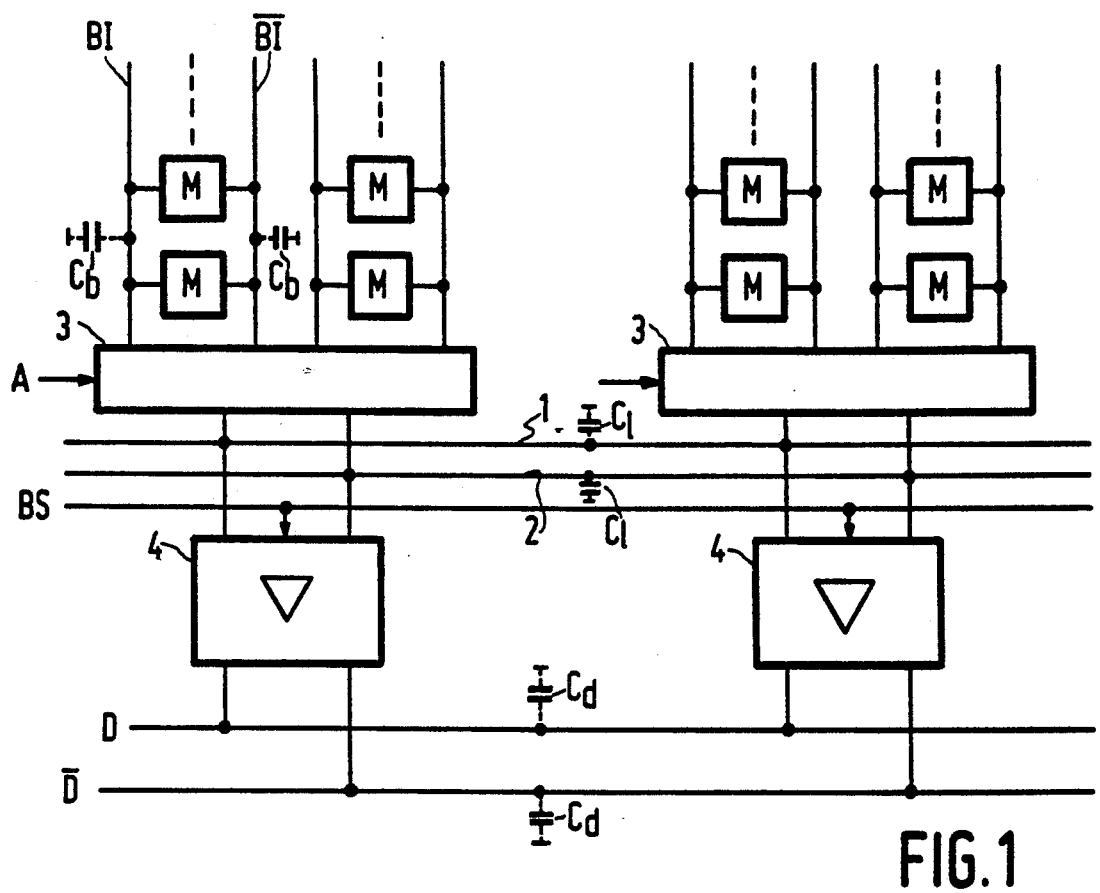
FIG. 1 shows a memory circuit in accordance with the invention.

FIG. 1 shows a memory circuit in accordance with the invention. The memory circuit comprises memory cells M which are arranged in rows and columns. Via bit lines BI and $\overline{BI}$ and a column decoder 3, the memory cells M are connected to the respective inputs of a sense amplifier 4 and to common input lines 1 and 2. The respective outputs of the sense amplifiers 4 are connected to common read lines D and $\overline{D}$, respectively. The sense amplifiers are connected to a common input line BS.

The operation of the part of the memory circuit which is shown in FIG. 1 will be described as regards the reading of information from a memory cell M. Using a row selection signal (not shown), a row of memory cells M is selected. As a result, the memory information of the relevant row of memory cells M is applied to the relevant bit lines BI and $\overline{BI}$. Subsequently, using a decoding signal A and the column decoder 3, a single memory column is selected. Memory information of a single memory cell M is thus applied to the input lines 1 and 2. Subsequently, the sense amplifiers 4 are simultaneously activated by means of a control signal on the common input line BS, so that the memory information is applied to the read lines D and $\overline{D}$ in amplified form.

In integrated circuits the bit lines BI and $\overline{BI}$ and the input lines 1 and 2 will have a parasitic capacitance $C_b$ and $C_1$, respectively, with respect to the substate which is usually connected to a power supply terminal. The value of said parasitic capacitances $C_b$ and $C_1$ is directly proportional to the length of the bit lines BI and $\overline{BI}$ and the input lines 1 and 2, respectively. Because the length of the input lines 1 and 2 is proportional to the selected number of memory columns in a matrix of the memory circuit, the value of the parasitic capacitance $C_1$ is proportional to the number of memory columns selected.

A selected memory cell is loaded by the sum of the bit line capacitance $C_b$ and the input line capacitance $C_1$. In practical cases the bit line capacitance $C_b$ will be many times higher than the input line capacitance $C_1$ ($C_b >> C_1$), because the length of a memory column is usually selected to be greater than the number of memory columns to be connected to the common input lines 1 and 2. The sum of the above capacitances then approximately equals the bit line capacitance $C_b$ and remains approximately constant when the number of memory columns to be connected to the common input lines 1 and 2 is selected to be larger or smaller.

The outputs of the sense amplifiers 4 are loaded by the parasitic capacitance $C_d$ of the read lines D and $\overline{D}$. The value of the capacitance $C_d$ is directly proportional to the length of the read line D or $\overline{D}$, which length is also proportional to the number of memory columns connected to the common input lines 1 and 2. The speed at which the read line capacitance $C_d$ can be charged or discharged depends on the value of the capacitance $C_d$, but in the memory circuit in accordance with the invention it also depends on the number of sense amplifiers 4 connected to the common read lines D and $\overline{D}$. This is because, when the number of sense amplifiers 4 increases, the total gain power of the sense amplifiers 4 increases because the sense amplifiers 4 are simultaneously activated by a signal on the common input line BS.

This means that the speed at which the memory information is read from a memory cell M on common input lines 1 and 2 is substantially independent of the number of memory columns connected to the input lines 1 and 2. As a result, the speed of reading of a memory circuit in accordance with the invention remains substantially constant when the number of memory columns is varied.

Figure 2:
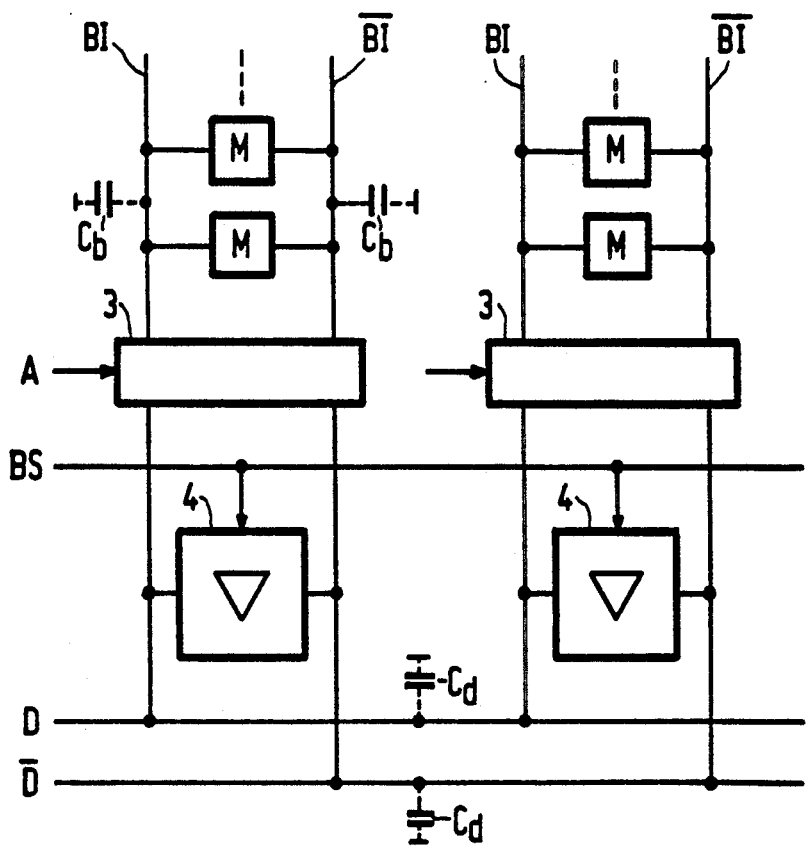
FIG. 2 shows a preferred embodiment of a memory circuit in accordance with the invention.

FIG. 2 shows a preferred embodiment of a memory circuit in accordance with the invention. Elements which correspond to elements shown in FIG. 1 are denoted by corresponding reference symbols. As appears from FIG. 2, the sense amplifiers comprise combined inputs and outputs so that the common input lines 1 and 2 of FIG. 1 can be dispensed with. Moreover, in this case each memory column is connected to a separate sense amplifier 4.

The operation of the part of the memory circuit shown in FIG. 2 corresponds substantially to that of the circuit shown in FIG. 1. After the selection of a row of memory cells M by means of a row selection signal (not shown), the relevant cell information is applied to the relevant bit lines BI and $\overline{BI}$. Using a decoder signal A and the column decoder 3, a single memory column is selected. This information is then present on the input/output of the sense amplifier 4 in the relevant column. Via the common read lines D and $\overline{D}$ this information is also available on the input/output of every other sense amplifier 4 connected thereto. Upon activation of each sense amplifier 4 by means of a control signal on the common input line BS, the cell information is applied to the common read lines D and $\overline{D}$ in amplified form. As has already been stated in the description of the circuit shown in FIG. 1, the read line capacitance $C_d$ again increases when the number of memory columns increases, but the total gain of the sense amplifiers 4 then also increases, so that the speed of reading again remains substantially constant.

The selection of sense amplifiers 4 having combined inputs and outputs in FIG. 2 offers the advantage that the input lines 1 and 2 shown in FIG. 1 can be dispensed with. As a result, less chip surface area will be required. Moreover, the memory information is taken over more quickly by the sense amplifiers, because the sense amplifiers amplify the information signal (latch). The selection of a sense amplifier 4 provided for each memory column offers the advantage that the memory circuit can be extended with single columns. In an embodiment of a memory circuit in accordance with the invention as shown in FIG. 1, the memory circuit can be extended only in multiples of two columns because of the presence of a single sense amplifier.

Figure 3:
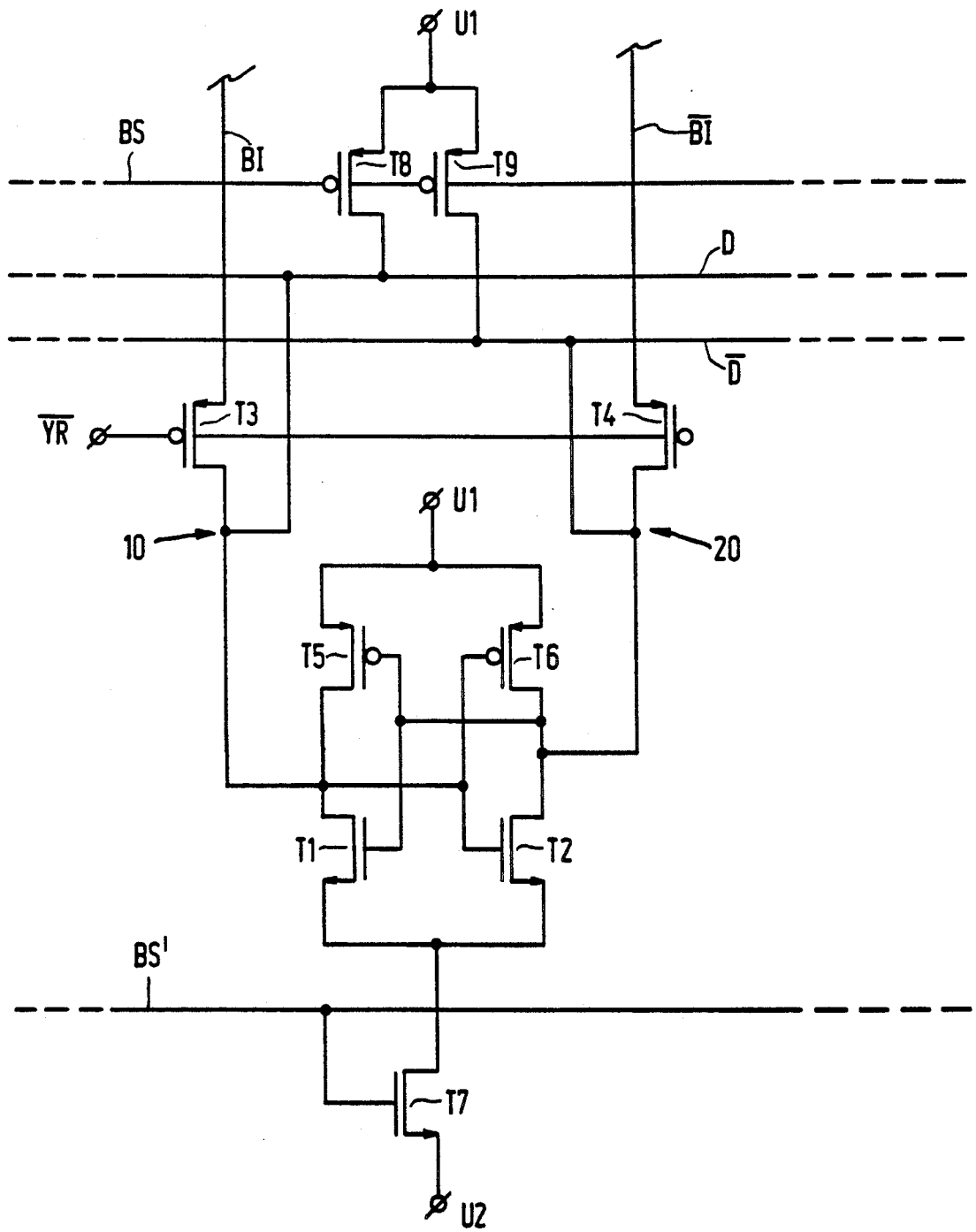
FIG. 3 is a detailed representation of a preferred embodiment of a part of the memory circuit shown in FIG. 2.

FIG. 3 is a detailed representation of a preferred embodiment of a sense amplifier 4 and a column decoder 3 as shown in FIG. 2. The single sense amplifier shown comprises three NMOS transistors T1, T2 and T7 and six PMOS transistors T3, T4, T5, T6, T8 and T9. The sources of the transistors T1 and T2 are connected to one another and to the drain of the transistor T7. The drains of the transistors T1 and T5 are connected to one another, to the gates of the transistors T2 and T6, and to the drain of the transistor T3. Similarly, the drains of the transistors T2 and T6 are connected to one another, to the gates of the transistors T1 and T5, and to the drain of the transistor T4. The gates of the transistors T3 and T4 are connected to an input terminal $\overline{YR}$ (for the reception of a decoder signal A), the sources of the transistors T3 and T4 being connected to a bit line BI, $\overline{BI}$, respectively. The drains of the transistors T3 and T8 and the drains of the transistors T4 and T9 are connected to a read line D, $\overline{D}$, respectively. The sources of the transistors T5, T6, T7 and T9, and the source of the transistor T7 are coupled to the power supply terminal U1, U2, respectively. The gates of the transistors T8 and T9 are connected to an input line BS. The gate of the transistor T7 is connected to an input line BS'.

Hereinafter, signals which are logic low and logic high will be referred to as "low" and "high", respectively. Furthermore, n-type transistors are to be understood to mean either n-channel field-effect transistors or bipolar npn-transistors, and p-type transistors are to be understood to mean either p-channel field-effect transistors or bipolar pnp-transistors.

The circuit shown in FIG. 3 operates as follows. In the case of a "low" signal of the input lines BS and BS', the transistors T8 and T9 are turned on and the transistor T7 is turned off. The read lines D and $\overline{D}$ are thus precharged via the transistors T8 and T9. In response to a subsequent "high" signal on the input line BS, the transistors T8 and T9 are turned off. In the case of a "low" signal A on the input line $\overline{YR}$, which signal originates, for example from an address decoder circuit (not shown) which is included in an integrated memory circuit for the selection of a column of the memory circuit, the transistors T3 and T4 are turned on.

Subsequently, upon a "high" and "low" signal of a selected memory cell on the bit lines BI and $\overline{BI}$, respectively, the read line D remains "high" and the non-read line $\overline{D}$ is partly discharged by a non-bit line $\overline{BI}$. In response to a subsequent "high" signal on the input line BS', the transistor T7 is turned on. Because of the "high" state of the node 10, the transistor T2 is turned on so that the node 20 is fully discharged and subsequently remains "low". As a result, the transistor T5 is turned on so that the node 10 remains "high".

In the case of a "low" and a "high" signal of a selected memory cell on the bit lines BI and $\overline{BI}$, respectively, the non-read line $\overline{D}$ remains "high" and the read line D is partly discharged by the bit line BI. In response to a subsequent "high" signal on the input line BS', the transistor T7 is turned on. Because of the "high" state of the node 20, the transistor T1 is turned on so that the node 10 is fully discharged and subsequently remains "low". As a result, the transistor T6 is turned on and the node 20 remains "high".

The signal on the input line BS' can be simply derived from the signal on the input line BS by means of delay elements (for example, by means of two series-connected inverters (not shown).

The nodes 10 and 20 are connected to a common read line D and a non-read line D', respectively, in the described manner. As has already been stated, these read lines have a parasitic capacitance which is proportional to the number of memory columns connected to the read lines D and $\overline{D}$. The speed at which said capacitance can be discharged during successive read operations depends on the parasitic capacitance of the read lines D and $\overline{D}$ and on the conductivity of the transistors T1, T2 and T7, but in the memory circuit in accordance with the invention it is also dependent on the number of sense amplifiers connected to the common read lines D and $\overline{D}$. The latter can be illustrated as follows: a voltage at the node 10 or the node 20 of the sense amplifier shown in FIG. 1 is present, via the common read lines D and $\overline{D}$, on the inputs of all sense amplifiers which are subsequently activated by the common input signal BS and subsequently by BS' per matrix, thus amplifying the voltages presented on the read lines D and $\overline{D}$ which are ultimately latched at a "high" or a "low" level. The speed of amplification and latching of the voltages presented depends on the capacitance of the read lines D and $\overline{D}$ and on the total conductivity of the transistors of all sense amplifiers coupled to the read lines D and $\overline{D}$. When the number of columns of memory cells in a matrix increases, each column being connected to the common read lines D and $\overline{D}$ via a read amplifier, therefore, the capacitance of the read lines increases because the length of these lines also increases. However, the total conductivity of the parallel-connected sense amplifiers also increases. This means that the speed of amplification and subsequent latching of voltages presented on the read lines D and $\overline{D}$ is substantially independent of the number of memory columns to be selected which are connected to the common read lines D and $\overline{D}$.

The sense amplifier shown in FIG. 3 is constructed by means of MOS-transistors; however, said NMOS-transistors and PMOS-transistors can be replaced by bipolar npn-transistors and pnp-transistors, respectively.

In the foregoing the reading of information (1 bit) from a single memory cell in a matrix has been described. It will be evident that in accordance with the invention the simultaneous reading of information from memory cells in separate matrices (for example, 8 bits) is also possible.

What is claimed is:

1. An integrated circuit with a memory, comprising a matrix of memory cells and sense amplifiers which are coupled thereto, outputs of said sense amplifiers being connected to one another and to a common data bus, activatable and deactivatable coupling means for coupling a single memory column to the input of each sense amplifier, the input of each sense amplifier being connected to its output, and activation means for simultaneously activating each sense amplifier.

2. An integrated circuit with a memory as claimed in claim 1, characterized in that a sense amplifier is provided for each memory column.

3. An integrated circuit with a memory as claimed in claim 1, characterized in that each memory cell in a column is coupled to a first and a second bit line, each sense amplifier comprising a first and a second transistor, the second main electrodes of which are connected to read lines, the first main electrodes being connected to one another and to a controllable current source, the controllable current source in each column being suitable for the reception of a common activation signal, in series with the first and the second bit line and the second main electrode of the first and the second transistor, respectively, there being connected the current channel of a third and a fourth transistors, respectively, which third and fourth transistor are adopted for the reception of a common control signal from an address decoder circuit, a control electrode of the first and the second transistor being retrocoupled to the second main electrode of the second transistor and the first transistor, respectively.

4. An integrated circuit with a memory as claimed in claim 5, characterized in that the third and the fourth transistor are p-type transistors.

5. An integrated circuit with a memory as claimed in claim 4, characterized in that the second main electrode of the first and the second transistor is connected, via a fifth and a sixth transistor, respectively, to a first power supply terminal, the fifth and the sixth transistor being of a conductivity type opposite to that of the first and the second transistor, respectively, the control electrodes of the first and the fifth transistor and those of the second and the sixth transistor being interconnected.

6. An integrated circuit with a memory as claimed in claim 5, characterized in that the first and the second transistor are n-type transistors, the fifth and the sixth transistor being p-type transistors.

7. An integrated circuit with a memory as claimed in claim 6, characterized in that the second main electrodes of the first and the second transistors of the n-type are connected to a first power supply terminal via a seventh and an eighth transistor of the p-type, respectively, control electrodes of the seventh and the eighth transistor of the p-type being adapted for the reception of the common activation signal, the control electrodes of the controlled current sources in the matrix being suitable for receiving a signal derived from the common activation signal via delay means.

* * * * *